(12) United States Patent
Hu

(10) Patent No.: US 9,778,553 B2
(45) Date of Patent: Oct. 3, 2017

(54) LIGHT-EMITTING APPARATUS AND A RELATED PROJECTION SYSTEM

(71) Applicant: APPOTRONICS CHINA CORPORATION, Shenzhen (CN)

(72) Inventor: Fei Hu, Shenzhen (CN)

(73) Assignee: APPOTRONICS CHINA CORPORATION, Shenzhen (CN)

( * ) Notice: Subject to any disclaimer, the term of this patent is extended or adjusted under 35 U.S.C. 154(b) by 6 days.

(21) Appl. No.: 14/773,303

(22) PCT Filed: Mar. 3, 2014

(86) PCT No.: PCT/CN2014/072779
§ 371 (c)(1),
(2) Date: Sep. 4, 2015

(87) PCT Pub. No.: WO2014/135040
PCT Pub. Date: Sep. 12, 2014

(65) Prior Publication Data
US 2016/0026076 A1   Jan. 28, 2016

(30) Foreign Application Priority Data

Mar. 6, 2013 (CN) .......................... 2013 1 0071414

(51) Int. Cl.
*G03B 21/20* (2006.01)
*F21V 13/08* (2006.01)
(Continued)

(52) U.S. Cl.
CPC ............ *G03B 21/2066* (2013.01); *F21V 7/22* (2013.01); *F21V 9/16* (2013.01); *F21V 13/08* (2013.01);
(Continued)

(58) Field of Classification Search
CPC . G03B 21/204; G03B 21/2066; G02B 26/008
See application file for complete search history.

(56) References Cited

U.S. PATENT DOCUMENTS

| 5,900,640 A | 5/1999 | Ogura |
| 2008/0049582 A1 | 2/2008 | Nishioka et al. |

(Continued)

FOREIGN PATENT DOCUMENTS

| CN | 101131834 A | 2/2008 |
| CN | 101140407 | 3/2008 |

(Continued)

OTHER PUBLICATIONS

International Search Report in the parent PCT application No. PCT/CN2014/072779, dated Jun. 3, 2014.

(Continued)

*Primary Examiner* — Christina Riddle
*Assistant Examiner* — Christopher Lamb, II
(74) *Attorney, Agent, or Firm* — Chen Yoshimura LLP

(57) ABSTRACT

A light-emitting apparatus and a related projection system. The light-emitting apparatus comprises an excitation light source generating an excitation light and a first supplemental laser source generating a first light; a wavelength conversion apparatus comprising a first wavelength conversion layer for absorbing the excitation light to generate a converted light without absorbing the first light; the wavelength conversion layer receiving at one side thereof the excitation light and the first light and emits at same side at least a portion of the first light; a light guide apparatus comprising a smaller first area and a larger second area, the first light and the excitation light respectively entering the first and second areas via a first optical path, and being respectively guided by the first and second areas to the wavelength conversion apparatus;

(Continued)

the second area also guiding the converted light and the reflected first light to a second optical path.

11 Claims, 3 Drawing Sheets

(51) Int. Cl.
    *F21V 7/22*           (2006.01)
    *F21V 9/16*           (2006.01)
    *H04N 9/31*           (2006.01)
    *G02B 5/28*           (2006.01)
    *G02B 26/00*          (2006.01)
    *G02B 27/09*          (2006.01)
    *G02B 27/10*          (2006.01)
    *H01S 5/00*           (2006.01)
    *H01S 5/40*           (2006.01)

(52) U.S. Cl.
    CPC ........... *G02B 5/285* (2013.01); *G02B 26/008* (2013.01); *G02B 27/0905* (2013.01); *G02B 27/1006* (2013.01); *G03B 21/204* (2013.01); *H01S 5/005* (2013.01); *H04N 9/3158* (2013.01); *H04N 9/3161* (2013.01); *H04N 9/3164* (2013.01); *H01S 5/0071* (2013.01); *H01S 5/4087* (2013.01)

(56) References Cited

U.S. PATENT DOCUMENTS

| 2008/0055246 | A1 | 3/2008 | Okayama et al. | |
| 2012/0316397 | A1* | 12/2012 | Berben | A61B 18/22 600/182 |
| 2013/0100644 | A1* | 4/2013 | Hu | F21V 7/22 362/84 |
| 2014/0028983 | A1* | 1/2014 | Fujita | F21V 7/00 353/30 |
| 2014/0240677 | A1* | 8/2014 | Hu | G02B 27/14 353/30 |

FOREIGN PATENT DOCUMENTS

| CN | 202615106 U | 12/2012 | |
| CN | 102937773 | 2/2013 | |
| DE | WO 2013117390 A1 * | 8/2013 | ........... G03B 21/204 |

OTHER PUBLICATIONS

IPRP in the parent PCT application No. PCT/CN2014/072779, dated Sep. 8, 2015.

* cited by examiner

LIGHT-EMITTING APPARATUS AND A RELATED PROJECTION SYSTEM

BACKGROUND OF THE INVENTION

Field of the Invention

This invention relates to illumination and projection technologies, and in particular, it relates to a light emitting device and related projection system.

Description of Related Art

Using a blue light to excite a yellow phosphor material to generate a yellow light, and then dividing the yellow light into a green light and a red light, or combining the yellow light with the blue light to generate a white light, are commonly used techniques for light sources in current projection and display fields. However, currently used yellow phosphor material is usually a YAG (yttrium aluminum garnet) phosphor; in the yellow light generated by YAG phosphor under excitation, the component in the red wavelength range is relatively weak, so that when such light is used in projection and display applications, the red light generated by light division or the white light generated by light combination are not completely satisfactory.

One solution in conventional technology is to supplement a red light in the yellow light generated by the phosphor material. For example, FIG. 1 illustrates the structure of a conventional light emitting device. As shown in FIG. 1, the light emitting device includes a blue laser source 110, a red laser source 120, filter plates 130 and 140, a reflection type color wheel device 150, a lens 160 and a light rod 170. The filter plate 130 reflects blue light and transmits other lights. The filter plate 140 transmits yellow light and reflects red light. The excitation light emitted by the blue laser source 110 is reflected by the filter plate 130 to the wavelength conversion device 150. The wavelength conversion device 150 includes a yellow phosphor, which absorbs the excitation light and generates a yellow converted light, which transmits through the filter plate 130 to be output along an optical path separated from the optical path of the excitation light. The filter plate 140 is located on the optical path of the yellow converted light outputted by the filter plate 130; it is used to combine the yellow converted light and the red laser light, which are respectively incident on the two sides of the filter plate 140, into one light beam. The combined light beam is collected by the lens 160 and homogenized by the light rod 170.

However, in this device, because the converted light emitted by the phosphor material has a Lambertian distribution, while the laser light has a Gaussian distribution, the combination of the two light beams is not uniform. Even after mixing by the light rod 170, its uniformity is still unsatisfactory.

Meanwhile, with the ever increasing requirement for high brightness of the light emitting device, the power required for the blue laser source 110 is higher and higher. This requires the blue light source to use more laser diodes, which increases the light emitting surface area of the blue light source. On the other hand, the red laser source 120, which acts as supplemental light source, only requires a relatively small amount of light, so the cross-section area of the output light beam of the red laser source 120 is relatively small.

SUMMARY

An object of the present invention is to provide a light emitting device that has a relatively simple structure.

An embodiment of the present invention provides a light emitting device, which includes:

An excitation light source, for generating an excitation light;

A first supplemental laser source, for generating a first light;

A wavelength conversion device, including a wavelength conversion layer which absorbs the excitation light to generate a converted light, without absorbing the first light, wherein the wavelength conversion layer receives the excitation light and the first light on one side of it, and outputs, from the same side, at least a part of the first light and at least a part of the converted light or at least a part of a combined light of the converted light and un-absorbed excitation light;

A light guiding device, including a first region and a second region, the first region being smaller than the second region, wherein the first light from the laser source and the excitation light from the excitation light source are respectively incident, along a first optical path, on the first region and at least the second region of the light guiding device, and are directed to the wavelength conversion device by the first region and at least the second region respectively, and wherein the second region of the light guiding device further directs the converted light and the reflected first light from the wavelength conversion device to a second optical path to be output.

Preferably, the light guiding device includes a first filter plate and a first reflective element, wherein the first filter plate includes a first position and a second position, wherein the first reflective element is stacked and affixed on the first position of the first filter plate;

Wherein the first position of the first filter plate and the first reflective element form the first region of the light guiding device, for reflecting the first light incident along the first optical path to the wavelength conversion device;

Wherein the second position of the first filter plate forms the second region of the light guiding device, for reflecting the excitation light which is incident along the first optical path to the wavelength conversion device, and transmitting the converted light and the first light from the wavelength conversion device to the second optical path to be output.

Preferably, the light guiding device includes a first filter plate, wherein the first filter plate includes a first position and a second position, wherein an aperture is provide at the first position;

Wherein the first position of the first filter plate forms the first region of the light guiding device, for transmitting the first light incident along the first optical path to the wavelength conversion device;

Wherein the second position of the first filter plate forms the second region of the light guiding device, for transmitting the excitation light incident along the first optical path to the wavelength conversion device, and reflecting the converted light and the first light from the wavelength conversion device to the second optical path to be output.

Preferably, the wavelength conversion layer generates a yellow converted light, and wherein the first light is a red laser light.

Preferably, the light emitting device further includes a second supplemental laser source which generates a second light and a scattering device, wherein the scattering device scatters the second light from the second supplemental laser source;

Wherein the light guiding device receives, on a side facing away from the incident converted light, the second light which has been scattered by the scattering device and directs it to the second optical path to be output.

Preferably, the scattering device includes a first surface and a second surface opposite each other;

Wherein the second light from the second supplemental laser source and the first light from the first supplemental laser source are incident together along the first optical path onto the first region of the light guiding device, wherein the first region of the light guiding device directs the second light to the first surface of the scattering device, wherein the second light is scattered by the scattering device and exits the first surface of the scattering device onto a side of the light guiding device that faces away from the incident converted light.

Preferably, the scattering device and the wavelength conversion device are fixed relative to each other, wherein the light emitting device further includes a drive device, for driving the wavelength conversion device and the scattering device such that light spots respective formed by the first light and the second light on the wavelength conversion device and the scattering device move along predetermined paths;

Wherein the light guiding device further includes a second reflective device, for directing at least a part of the second light that has been scattering reflected to a side of the light guiding device that faces away from the incident converted light.

Preferably, the second reflective device further directs the second light from the second supplemental laser source to the scattering device.

Preferably, the second light from the second supplemental laser source is incident along the first optical path on the light guiding device, and is directed by the light guiding device to the second reflective device.

Preferably, the wavelength conversion device further includes a scattering reflective layer which is stacked with the wavelength conversion layer, wherein a side of the wavelength conversion layer that faces away from the scattering reflective layer receives the excitation light and the first light.

Embodiments of the present invention also provide a projection system which includes the above light emitting device.

Compare to conventional technologies, the present invention has the following advantages:

Because the supplemental light beam emitted by the supplemental laser source has a relatively small cross-section, the first region of the light guiding device, which has a relatively small size, can direct the supplemental light to the wavelength conversion device; while the excitation light beam generated by the excitation light source, the converted light beam emitted by the wavelength conversion device, and at least a part of the supplemental light scattering reflected by the wavelength conversion layer have relatively large cross-sections, so that the second region, which has a relatively large size, can direct the excitation light to the wavelength conversion layer and can at the same time direct the converted light and at least a part of the supplemental light that has been scattering reflected to the secondo optical path, so as to be separated from the optical path of the excitation light. This way, the light division and light combination are accomplished by the light guiding device, resulting in a simple structure for the light emitting device.

DETAILED DESCRIPTION OF PREFERRED EMBODIMENTS

Embodiments of the present invention are described in detail below with reference to the drawings.

First Embodiment

Figure 1:
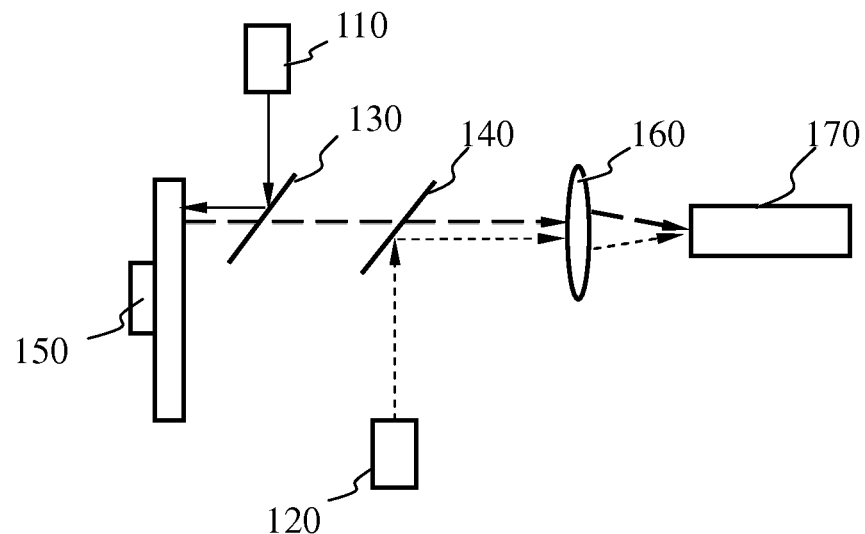
FIG. 1 illustrates the structure of a light emitting device according to conventional technology.
Figure 2:
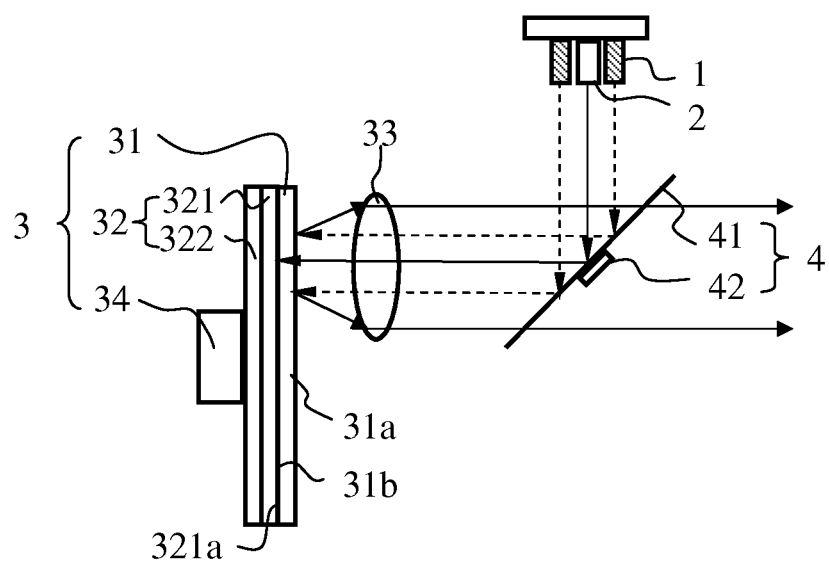
FIG. 2 illustrates the structure of a light emitting device according to an embodiment of the present invention.

Refer to FIG. 2, which illustrates the structure of a light emitting device according to an embodiment of the present invention.

The light emitting device includes an excitation light source 1, a first supplemental laser source 2, wavelength conversion device 3 and light guiding device 4.

The excitation light source 1 generates an excitation light. The first supplemental laser source 2 generates a first light. To provide a high brightness light emitting device, the excitation light source 1 uses an array of a relatively large number of light emitting elements. Because the required amount of first light, which acts as a supplemental light to improve the color of the output light, is relatively small, the number of laser diodes in the first supplemental laser source 2 is far fewer that the number of light emitting elements in the light emitting element array of the excitation light source 1. In this embodiment, the excitation light source 1 is a blue laser source, the first supplemental laser source 2 is a red laser source, and the two laser sources are arranged on the same plane to form an array, where the excitation light source 1 surrounds the first supplemental laser source 2. Of course, in practice, the color generated by the excitation light source 1 and the first supplemental laser source 2 can be other colors and not limited to the above examples. Preferably, the former is a 445 nm blue laser source emitting which has a relatively high excitation efficiency. The excitation light source 1 can also include light emitting diodes or other solid state light emitting element array, not limited to laser diodes.

The first light and the excitation light are incident together on the light guiding device 4 from the first optical path. The light guiding device 4 includes a first filter plate 41 and a first reflective element 42. The first filter plate 41 reflects the excitation light and transmits the converted light and the first light. The first filter plate 41 includes a first position and a second position, and the first reflective element 42 is affixed to the first position, for reflecting the first light. In this embodiment, the first reflective element 42 is a small reflecting mirror. The light guiding device 4 includes a first region and a second region, where the first position of the first filter plate 41 and the first reflective element 42 form the first region, and the second position of the first filter plate 41 forms the second region.

An aperture may be provided at the first position of the first filter plate 41, and the first reflective element 42 can be affixed in the aperture. For ease of manufacture, preferably, the first reflective element 42 is directly stacked and affixed to the first position of the first filter plate 41. The first reflective element 42 may be affixed on the first filter plate 41 either on the side facing away from or on the side facing toward the first supplemental laser source 2; preferably it is the latter, so as to avoid loss caused by the first light having to pass through the first filter plate 41 both before and after reflection by the first reflective element 42.

To make the two regions of the light guiding device 4 respectively correspond to the arrangement position of the first supplemental laser source 2 and the excitation light source 1, the second region surrounds the first region, so that the first light emitted by the first supplemental laser source 2 is incident along the first optical path on the first region of the light guiding device 4, and is reflected by the first reflective element 42 to the wavelength conversion device 3, while the excitation light emitted by the excitation light source 1 is incident along the first optical path on the second region of the light guiding device 4, and is reflected by the first filter plate 41 to the wavelength conversion device 3. Because there are more light emitting elements in the excitation light source 1 than in the first supplemental laser source 2, the first region of the light guiding device 4 is smaller than the second region.

The wavelength conversion device 3 includes a wavelength conversion layer 31 and a scattering reflective substrate 32 stacked together. The wavelength conversion layer 31 includes a first surface 31a and a second surface 32a opposite each other. The first surface 31a faces away from the scattering reflective substrate 32, and is used to receive the excitation light and the first light. The wavelength conversion layer 31 is provided with a wavelength conversion material, which absorbs the excitation light and outputs a converted light or a combined light of the converted light and un-absorbed excitation light. Meanwhile, the wavelength conversion material does not absorb the first light, so that the first light from the light guiding device 4 transmits through the wavelength conversion layer 31 to reach the scattering reflective substrate 32.

In this embodiment, the wavelength conversion material is a yellow wavelength conversion material, which absorbs the excitation light and converts it to a yellow converted light. The converted light has a Lambertian distribution. In practice, the wavelength conversion material may be phosphor material, quantum dots, fluorescent dye or other materials with wavelength conversion capabilities. The wavelength conversion material is typically adhered together with an adhesive material to form a solid mass. A typical adhesive for this purpose is silica gel, which has stable chemical properties and a relatively high mechanical strength. But the temperature resistance of silica gel adhesive is relatively low, typically between 300-500 degrees C. For applications in high power lighting devices, preferably, an inorganic adhesive such as sodium silicate or glass dust may be used to adhere the wavelength conversion material into a solid mass, to accomplish a reflection type phosphor wheel that can withstand high temperature. For example, the phosphor powder can be mixed with glass dust (if the temperature requirement is low, a low temperature glass dust may be used) and melted under an inert gas environment to form a desired shape.

The scattering reflective substrate 32 includes a scattering reflective layer 321 and a base plate 322 stacked together. The scattering reflective layer 321 is located between the base plate 322 and the wavelength conversion layer 31, and its surface adjacent the wavelength conversion layer 31 is a third surface 321a.

The scattering reflective layer 321 includes a scattering material or a scattering structure, used to totally scatter the first light that has passed through wavelength conversion layer 31 and the converted light emitted from the second surface 31b of the wavelength conversion layer 31 and to output all of the scattered light from the third surface 321a, so that the first light output from the third surface 321a has a near Lambertian distribution. To achieve this, the scattering reflective layer 321 in this embodiment should be sufficiently thick, so that when the loss due to the slight absorption of the light by scattering material is neglected, all of the light exiting the second surface 31b of the wavelength conversion layer 31 is scattering reflected by the scattering reflective layer 321 back to the wavelength conversion layer 31, and is ultimately all emitted from the first surface 31a of the wavelength conversion layer 31. The combined light of the first light and the converted light that is ultimately emitted from the first surface 31a of the wavelength conversion layer 31 is a uniform combination because the angular distributions of the two lights match each other.

To affix the scattering reflective layer 321, the scattering reflective substrate 32 is provided with the base plate 322 to support the scattering reflective layer 321. However, if the rigidity of the scattering reflective layer itself is sufficient (for example, when the scattering material is mixed in a transparent glass to form a solid shape), the base plate 322 may be omitted. In this embodiment, the base plate 322 may be coated with a reflective coating to ensure that all of the light scattered by the scattering reflective layer 321 is emitted from the second surface 321a.

It should be pointed out that the stacked wavelength conversion layer 31 and scattering reflective substrate 32 are in tight and direct contact with each other, to increase the binding force between the wavelength conversion layer 31 and the scattering reflective substrate 32. Further, the tight contact of the two can reduce the distance between the light output surface and the scattering reflective substrate 32, thereby reducing the divergence of the light in the wavelength conversion layer 31. Similarly, the scattering reflective layer 321 and base plate 322 of the scattering reflective substrate 32 have the same relationship.

Of course, when the wavelength conversion layer 31 is sufficiently thick and has sufficient rigidity by itself, the scattering reflective substrate 32 can be omitted. This way, at least a part of the first light is scattering reflected by the wavelength conversion layer 31 and exits the first surface 31a, and is combined with at least a part of the converted light or the combined light of the converted light and at least a part of the un-absorbed excitation light, which also exits the first surface 31a. Some of the light will be lost, but this structure may be adopted if the light loss is not a main concern.

Because the output light of the wavelength conversion device 3 has a Lambertian distribution, a collection lens 33 is preferably provided on the output path of the wavelength conversion device 3, to collect the output light from the wavelength conversion device 3 and deliver it to the light guiding device 4, in order to increase light utilization efficiency.

The combined light of the converted light and the first light outputted by the wavelength conversion device 3 is collected and inputted to the light guiding device 4, where the combined light incident on the second region is transmitted through the first filter plate 41 and outputted along the second optical path, while the combined light incident on the first region is reflected by the first reflective element 42 and become lost. Because the size of the first region is much smaller than that of the second region, this loss can be neglected. If the output light from the wavelength conversion device 3 contains un-absorbed excitation light, because the first filter plate 41 reflects the excitation light, this part of the excitation light is reflected and become lost. Therefore, the wavelength conversion device 3 preferably contains sufficient wavelength conversion material in order to completely absorb the excitation light to avoid this loss.

Since the first supplemental laser source 2 emits a laser light, and the laser light has a Gaussian distribution, while the converted light has a Lambertian distribution, in the conventional technology described earlier, the combined light generated by directly combining the converted light and the first light i.e. the supplemental light is not uniform. In this embodiment, the first light that transmits through the wavelength conversion layer 31 is scattering reflected by the scattering reflective layer and has a near Lambertian distribution. This way, the converted light and the first light emitted by the first surface 31a of the wavelength conversion layer 31 are uniformly combined due to their matching angular distribution. Moreover, the light guiding device 4 separates the optical path of the first light incident on the wavelength conversion device 3 and that of the first light output from the wavelength conversion device 3 based on their etendue difference, and in the mean time the light guiding device 4 separates the optical path of the excitation light and that of the converted light based on wavelength ranges, so the light emitting device has a simple structure.

In this embodiment, the scattering reflective layer 321 preferably includes white porous ceramic or white scattering materials. The white scattering material may be a salt or oxide, such as barium sulfate powder, aluminum oxide powder, silica powder, etc., which are essentially non-absorbent of light. Moreover, the white scattering materials have stable properties and will not oxidize under high temperature.

In this embodiment, the first reflective element 42 may alternatively be a filter plate, for reflecting the first light and transmitting the converted light. This way, when the combined light emitted from the wavelength conversion device 3 is incident on the first region of the light guiding device 4, only the first light in the combined light is reflected and become lost, while the converted light in the combined light is transmitted through the first reflective element 42 and is outputted along the second optical path. In this case, the first reflective element 42 and the first filter plate 41 can be combined as one filter plate, which has different coatings in different regions.

In this embodiment, the light emitted by the excitation light source 1 and the light emitted by the first supplemental laser source 2 can be combined in other ways than the geometry based combination shown in FIG. 2; for example, they can be combined by a second filter plate (not shown in the drawing) or a polarization plate and then directed to the light guiding device 4. It should be noted that the region where the first light is incident on the second filter plate or the polarization plate should spatially correspond to the first region of the light guiding device 4, so that when the first light that is transmitted or reflected by the second filter plate or the polarization plate is incident on the light guiding device 4, it completely falls in the first region. In such an embodiment, because the excitation light and the first light are combined based on wavelengths or polarizations, the combined light outputted by the second filter plate or the polarization plate may contain excitation light which is incident on the first region of the light guiding device 4, so the first reflective element 42 should reflect the excitation light as well. This can improve the light power density of the excitation light incident on the wavelength conversion device 3.

In this embodiment, the relationship between the first region and the second region of the light guiding device 4 can be other than one where the latter surrounds the former, as long as the spatial arrangement of the first supplemental laser source 2 corresponds to the spatial arrangement of the first region of the light guiding device 4 so that the first light is incident on the first region. Of course, the first region is preferably located at the center of the light guiding device 4, so that the first light from the light guiding device 4 can be collected by the center area of the collection lens 33 onto the wavelength conversion device 3, which is more efficient.

In this embodiment, the wavelength conversion device 3 may additionally include a drive device 34, which drives the wavelength conversion layer 31 to move, so that the light spot formed by the excitation light on the wavelength conversion layer 31 acts upon the wavelength conversion layer 31 along a predetermined path. This avoids the problem of increased temperature of the wavelength conversion layer 31 caused by the excitation light acting upon the same position of the wavelength conversion layer 31 for prolonged periods of time. Specifically, in this embodiment, the drive device 34 drives the wavelength conversion layer 31 to rotate, so that the light spot formed by the excitation light on the wavelength conversion layer 31 acts upon the wavelength conversion layer 31 along a predetermined circular path. Preferably, the wavelength conversion device 3 has a round plate shape, the wavelength conversion layer 31 is a ring shape concentric with the round plate, and the drive device 34 is a cylindrical shaped motor and is coaxially connected with the wavelength conversion layer 31. In other implementations of this embodiment, the drive device 34 may drive the wavelength conversion layer 31 to move in other manners, such as horizontal linear oscillation motion, etc. When the wavelength conversion material of the wavelength conversion layer 31 is able to withstand high temperature, the drive device can be omitted for the wavelength conversion device 3.

Figure 3:
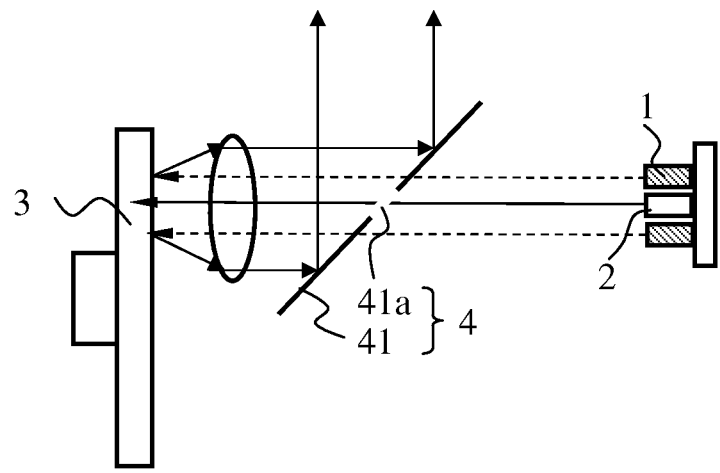
FIG. 3 illustrates the structure of a light emitting device according to another embodiment of the present invention.

Refer to FIG. 3, which illustrates the structure of a light emitting device according to another embodiment of the present invention. The light emitting device includes an excitation light source 1, a first supplemental laser source 2, a wavelength conversion device 3 and a light guiding device 4.

Differences between this embodiment and the embodiment of FIG. 2 include:

The light guiding device 4 includes a first filter plate 41; the first filter plate 41 includes a first position and a second position, where the first position is an aperture 41a. The first filter plate 41 transmits the excitation light and reflects the converted light and the first light. In this embodiment, the first position of the first filter plate forms the first region of the light guiding device 4, and the second position of the first filter plate forms the second region of the light guiding device 4. The excitation light emitted by the excitation light source 1 and the first light emitted by the first supplemental laser source 2 are incident along a first optical path on the light guiding device 4, where all of the first light is incident on the first region (i.e. the aperture 41a) and passes through it to reach the wavelength conversion device 3, while the excitation light is transmitted by the first filter plate 41 to reach the wavelength conversion device 3.

The converted light and the first light outputted by the wavelength conversion device 3 are incident on the light guiding device 4, where the light incident on the second region is reflected to the second optical path to be output, while the light incident on the first region (i.e. the aperture 41a) passes through it and becomes lost.

Second Embodiment

Figure 4:
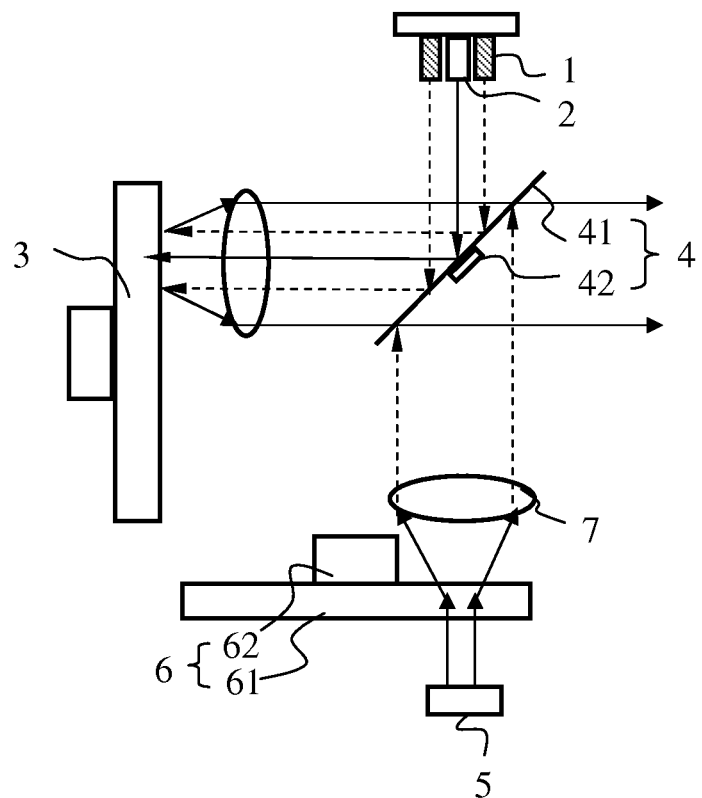
FIG. 4 illustrates the structure of a light emitting device according to another embodiment of the present invention.

Refer to FIG. 4, which illustrates the structure of a light emitting device according to another embodiment of the present invention. The light emitting device includes an excitation light source 1, a first supplemental laser source 2, a wavelength conversion device 3 and a light guiding device 4.

Differences between this embodiment and the embodiment of FIG. 2 include:

The light emitting device further includes a second supplemental laser source 5 and a scattering device 6. The scattering device 6 includes a scattering layer 61 for scattering the second light generated by the second supplemental laser source 5. The first filter plate 41 of the light guiding device 4 additionally reflects the second light. The scattered second light is incident on the first filter plate 41 of the light guiding device 4 on a side facing away from the converted light, and is reflected into the second optical path; it is combined with the converted light and the first light that have transmitted through the light guiding device 4 into one beam to be output.

Specifically, the second supplemental laser source 5 may generate a blue light, which is combined with the yellow light outputted by the wavelength conversion device 3 into a beam of white light to be output. Therefore, this embodiment can solve the problem of the embodiment of FIG. 2, which is that the excitation light and the converted light cannot be combined and outputted along the second optical path. Preferably, the second light is a blue light in the wavelength range of 460 nm to 480 nm, so that the blue color used for display or projection is more compliant with the REC709 standard.

Because the etendue of the second light is increased after being scattered by the scattering device 6, preferably, a collection lens 7 is provided on the output path of the scattering device 6, for collecting the second light outputted by the scattering device 6 and directing it to the first filter plate 41 of the light guiding device 4.

In this embodiment, the scattering device 6 may additionally include a drive device 62, which drives the scattering layer 61 to move, so that the light spot formed by the second light on the scattering layer 61 can act upon the scattering layer 61 along a predetermined path. This prevents heat concentration in one region. Further, because the drive device 62 drives the scattering layer 61 to move, the position of the incident laser light spot on the scattering layer 61 changes with time, so the position of the light spot region projected by the light emitting device changes with time; when the speed of change is sufficiently fast, human eyes cannot perceive the light spot. As a result, this device can more effectively eliminate speckles than stationary scattering devices.

Is should be understood that the light emitting device shown in FIG. 3 may also be provide with a second supplemental laser source and a scattering device. Correspondingly, the filter plate with aperture in the device of FIG. 3 can additionally transmit the second light. The scattered second light is incident on the filter plate on a side facing away from the converted light, and passes through the aperture to the second optical path; it is combined with the converted light and the first light that is reflected by filter plate into one light beam to be output.

Figure 5:
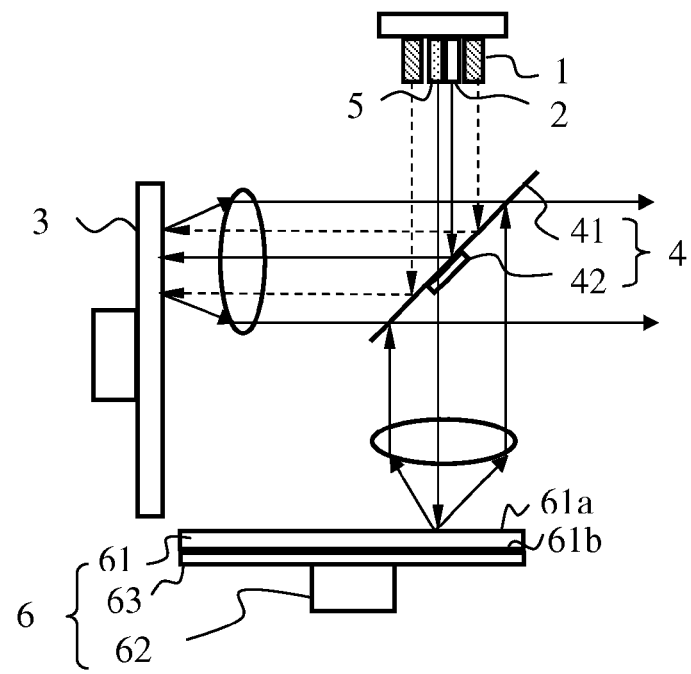
FIG. 5 illustrates the structure of a light emitting device according to another embodiment of the present invention.

Refer to FIG. 5, which illustrates the structure of a light emitting device according to another embodiment of the present invention. The light emitting device includes an excitation light source 1, a first supplemental laser source 2, a wavelength conversion device 3, a light guiding device 4, a second supplemental laser source 5 and a scattering device 6.

Differences between this embodiment and the embodiment of FIG. 4 include:

The first reflective element 42 of the light guiding device 4 is a filter plate, which reflects the first light and transmits the second light. The second light generated by the second supplemental laser source 5 and the first light generated by the first supplemental laser source 2 are incident together along a first optical path on the first reflective element 42; the first light is reflected by the first reflective element 42 to the wavelength conversion device 3, while the second light is transmitted through the first reflective element 42 to the scattering device 6.

The scattering device 6 includes a reflective substrate 63 and a scattering layer 61 disposed on the reflective substrate 63. The scattering layer 61 includes a first surface 61a and second surface 61b opposite each other. The second surface 61b is in contact with the reflective substrate 63, and the first surface 61a receives the second light which has transmitted through the light guiding device 4. The second light is scattered by the scattering layer 61; the second light that exits the second surface 61b of the scattering layer 61 is reflected by the reflective substrate 63 back into the scattering layer 61, and is output from the first surface 61a together with the second light that is directly output from that surface. This output second light is incident on the light guiding device 4 on the side facing away from the converted light; the second light incident on the second region of the light guiding device 4 is reflected into the second optical path to be output, while the second light incident on the first region is transmitted through it and become lost. The lost light is small and can be neglected. Of course, when the scattering layer 61 is sufficiently thick, the reflective substrate 63 may be omitted.

In the light emitting device of FIG. 4 which uses a transmission type scattering device, because the output light travels in the same direction as the incident light, and because there are inevitably local regions in the scattering device that scatter less of even form pin holes so that some incident laser light is scattered insufficiently or not scattered at all (i.e. it directly passes through the pin holes) before it is outputted, this part of the light retains strong directionality and does not obey the Lambertian distribution. If the thickness or density of the scattering device is increased to prevent pin holes, the transmission rate of the incident light will be greatly reduced, thereby reducing the efficiency of the scattering device.

To the contrary, this embodiment uses a reflection type scattering device where the output light travels in the opposite direction as the incident light, and the incident light must be scattering reflected and change it direction before it can be output. Moreover, increasing the density of thickness of the reflective device does not reduce its efficiency. Therefore, it has better scattering effect for laser beams and the output light is closer to a Lambertian distribution.

In this embodiment, the first reflective element 42 may alternatively transmit the first light and reflect the second light, as long as corresponding adjustments are made to the optical paths and the filter curve of the light guiding device. Those skilled in the relevant art can easily make such adjustments based on the above descriptions, so a detailed description is not necessary here.

In this embodiment, the first reflective element 42 may also be a polarization plate, and the first light and second light incident on the polarization plate along the first optical path have different polarization states, so that the polarization plate can separate the optical paths of the two light beams.

In this embodiment, when the light required from the first supplemental laser source 2 and the second supplemental laser source 5 are both relatively low, the two light sources can be arranged side by side on the same plane to form an array, corresponding to the first region of the light guiding device 4. If the lights required from the two supplemental laser sources are relatively high, the first light and the second light can be first combined using wavelength based or polarization based light combination, and then they can be further combined with the light from the excitation light source 1 using geometry based, wavelength based or polarization based light combination.

Figure 6:
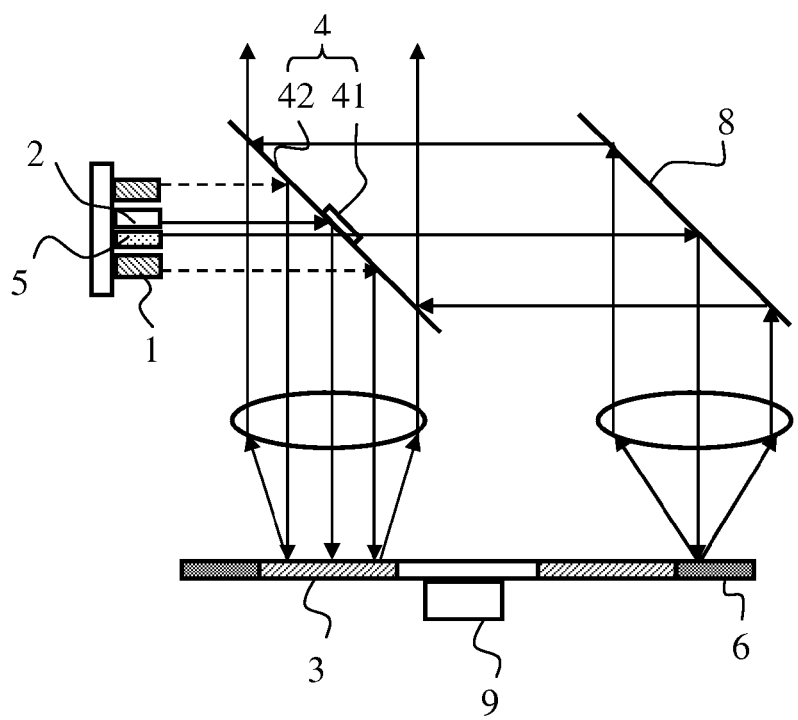
FIG. 6 illustrates the structure of a light emitting device according to another embodiment of the present invention.

Refer to FIG. 6, which illustrates the structure of a light emitting device according to another embodiment of the present invention. The light emitting device includes an excitation light source 1, a first supplemental laser source 2, a wavelength conversion device 3, a light guiding device 4 and a second supplemental laser source 5.

Differences between this embodiment and the embodiment of FIG. 5 include:

In this embodiment, the wavelength conversion device 3 and the scattering device 6 are affixed to each other by both being disposed on the same round substrate (not shown in the drawing), and both have ring shapes concentric with the round substrate. The two rings have different diameters, so that the wavelength conversion device 3 and the scattering device 6 are located in different ring shaped regions of the round substrate. The light emitting device further includes a drive device 9, coaxially connected to the round substrate, for driving the round substrate to rotate. The light emitting device further includes a second reflective device, which includes a second reflective element 8, for reflecting the second light from the light guiding device 4 to the scattering device 6. The second reflective element 8 may be a reflecting mirror or a filter plate that reflects the second light.

In this embodiment, because the scattering device and the wavelength conversion device are driven by the same drive device to rotate, one fewer drive device is required as compared to the light emitting device of FIG. 5, which reduces the cost and makes the device structurally simpler.

In practice, the wavelength conversion device 3 and the scattering device 6 may have other shapes, and the drive device may drive the two to move in other says, so long as the light spots respectively formed by first light and the second light on the wavelength conversion device and the scattering device move along predetermine paths. For example, the wavelength conversion device 3 and the scattering device 6 may have band shapes arranged adjacent to each other, and the drive device may drive them in a horizontal linear oscillation motion.

In this embodiment, because the wavelength conversion device 3 includes the stacked wavelength conversion layer and scattering reflective layer, the scattering reflective layer may be divided into two adjacent ring shaped regions, and the wavelength conversion layer may be stacked on one of the ring shaped regions of the scattering reflective layer, while the other ring shaped region functions as the scattering device. Further, when the scattering reflective layer has sufficient rigidity itself, the round substrate in this embodiment may be omitted.

In this embodiment, the second reflective element 8 may alternatively be provided with an aperture (not shown in the drawing), and correspondingly, the light from the second supplemental laser source 5 can be incident to the aperture of the second reflective element 8 from a side facing away from the scattering device 6 and pass through the aperture to reach the scattering device 6, rather than transmitting through the first filter plate 41 of the light guiding device 4 to reach the second reflective element 8. Because the second light outputted by the second supplemental laser source 5 has a Gaussian distribution with a relatively small etendue, while the second light after the scattering reflection has a near Lambertian distribution with a relatively large etendue, the optical path of the light output from the second supplemental laser source 5 and that of the light scattering reflected by the scattering device 6 can be separated based on their etendue difference. Although a part of the second light scattering reflected by the scattering device 6 will pass through the aperture of the second reflective element 8 and become lost, because the size of the aperture is much smaller than that of the second reflective element 8, this loss can be neglected.

Or, the second reflective device may include a third reflective element (not shown in the drawing), disposed on the optical path between the second reflective element 8 and the scattering device 6. The third reflective element may be a small reflecting mirror or a small filter plate that reflects the second light; the light from the second supplemental laser source 5 is incident on the third reflective element on a side facing toward the scattering device 6 and is reflected to the scattering device 6. Although a part of the second light reflected by the scattering device 6 is reflected by the third reflective element and cannot reach the second reflective element 8 and thus become lost, the size of the small reflective mirror is much smaller than the cross-sectional size of the second light that has been reflected by the scattering device 6, so the loss can be neglected.

Or, the scattering device 6 may be a transmission type device, and correspondingly, the light emitted by the second supplemental laser source 5 is incident on the scattering device 6 on a side that faces away from the second reflective element 8. At lease a part of the second light scattered by the scattering device 6 exits the scattering device 6 from a side facing the second reflective element 8 onto the second reflective element 8.

The various embodiments in this disclosure are described in a progressive manner such that each embodiment is described by emphasizing its differences from other embodiments. The common features of the various embodiments can be understood by reference to each other.

Another embodiment of the present invention is a projection system, which includes a light emitting device that has the structures and functions of the light emitting devices described in the above embodiments. The projection system may use a variety of suitable projection technologies, such as liquid crystal display (LCD) projection technology, digital light processor (DLP) projection technology, etc. In addition, the light emitting device may also be applied to illumination systems, such as stage lighting.

The above descriptions illustrate the various embodiments and implementations of the present invention, and do not limit the scope of the invention. Equivalent structures or processes based on the disclosure of this specification and drawings, or their direct or indirect applications in other related technology areas, are within the scope of protection of this invention.

What is claimed is:

1. A light emitting device, comprising:
   an excitation light source, for generating an excitation light;
   a first supplemental laser source, for generating a first light;
   a wavelength conversion device, including a wavelength conversion layer which absorbs the excitation light to generate a converted light, without absorbing the first light, wherein the wavelength conversion layer receives the excitation light and the first light on one side of the wavelength conversion layer, and outputs, from the same side, at least a part of the first light and at least a part of the converted light or at least a part of a combined light of the converted light and un-absorbed excitation light; and
   a light guiding device, including a first region and a second region, the first region being smaller than the second region, wherein the first light from the laser source is incident, along a first optical path, on the first region of the light guiding device and is directed to the wavelength conversion device only by the first region and not by the second region, wherein the excitation light from the excitation light source is incident, along the first optical path, on at least the second region of the light guiding device and is directed to the wavelength conversion device by at least the second region, and wherein the second region of the light guiding device further directs the converted light and the reflected first light from the wavelength conversion device to a second optical path to be output.

2. The light emitting device of claim 1, wherein the light guiding device includes a first filter plate and a first reflective element, wherein the first filter plate includes a first position and a second position, wherein the first reflective element is stacked and affixed on the first position of the first filter plate;
   wherein the first position of the first filter plate and the first reflective element form the first region of the light guiding device, for reflecting the first light incident along the first optical path to the wavelength conversion device; and
   wherein the second position of the first filter plate forms the second region of the light guiding device, for reflecting the excitation light incident along the first optical path to the wavelength conversion device, and transmitting the converted light and the first light from the wavelength conversion device to the second optical path to be output.

3. The light emitting device of claim 1, wherein the light guiding device includes a first filter plate, wherein the first filter plate includes a first position and a second position, wherein an aperture is provided at the first position;
   wherein the first position of the first filter plate forms the first region of the light guiding device, for transmitting the first light incident along the first optical path to the wavelength conversion device;
   wherein the second position of the first filter plate forms the second region of the light guiding device, for transmitting the excitation light incident along the first optical path to the wavelength conversion device, and reflecting the converted light and the first light from the wavelength conversion device to the second optical path to be output.

4. The light emitting device of claim 1, wherein the wavelength conversion layer generates a yellow converted light, and wherein the first light is a red laser light.

5. The light emitting device of claim 1, the light emitting device further comprising a second supplemental laser source for generating a second light and a scattering device, wherein the scattering device scatters the second light from the second supplemental laser source; and
   wherein the light guiding device receives, on a side facing away from the incident converted light, the second light which has been scattered by the scattering device and directs it to the second optical path to be output.

6. The light emitting device of claim 1, wherein the wavelength conversion device further includes a scattering reflective layer which is stacked with the wavelength conversion layer, wherein a side of the wavelength conversion layer that faces away from the scattering reflective layer receives the excitation light and the first light.

7. A projection system, comprising the light emitting device of claim 1.

8. A light emitting device, comprising:
   an excitation light source, for generating an excitation light;
   a first supplemental laser source, for generating a first light;
   a wavelength conversion device, including a wavelength conversion layer which absorbs the excitation light to generate a converted light, without absorbing the first light, wherein the wavelength conversion layer receives the excitation light and the first light on one side of it, and outputs, from the same side, at least a part of the first light and at least a part of the converted light or at least a part of a combined light of the converted light and un-absorbed excitation light;
   a light guiding device, including a first region and a second region, the first region being smaller than the second region, wherein the first light from the laser source and the excitation light from the excitation light source are respectively incident, along a first optical path, on the first region and at least the second region of the light guiding device, and are directed to the wavelength conversion device by the first region and at least the second region respectively, and wherein the second region of the light guiding device further directs the converted light and the reflected first light from the wavelength conversion device to a second optical path to be output; and
   a second supplemental laser source for generating a second light and a scattering device, wherein the scattering device scatters the second light from the second supplemental laser source;
   wherein the light guiding device receives, on a side facing away from the incident converted light, the second light which has been scattered by the scattering device and directs it to the second optical path to be output,
   wherein the scattering device includes a first surface and a second surface opposite each other;
   wherein the second light from the second supplemental laser source and the first light from the first supplemental laser source are incident together along the first optical path onto the first region of the light guiding device, wherein the first region of the light guiding device directs the second light to the first surface of the scattering device, wherein the second light is scattered by the scattering device and exits the first surface of the scattering device onto a side of the light guiding device that faces away from the incident converted light.

9. A light emitting device, comprising:

an excitation light source, for generating an excitation light;

a first supplemental laser source, for generating a first light;

a wavelength conversion device, including a wavelength conversion layer which absorbs the excitation light to generate a converted light, without absorbing the first light, wherein the wavelength conversion layer receives the excitation light and the first light on one side of it, and outputs, from the same side, at least a part of the first light and at least a part of the converted light or at least a part of a combined light of the converted light and un-absorbed excitation light;

a light guiding device, including a first region and a second region, the first region being smaller than the second region, wherein the first light from the laser source and the excitation light from the excitation light source are respectively incident, along a first optical path, on the first region and at least the second region of the light guiding device, and are directed to the wavelength conversion device by the first region and at least the second region respectively, and wherein the second region of the light guiding device further directs the converted light and the reflected first light from the wavelength conversion device to a second optical path to be output; and a second supplemental laser source for generating a second light and a scattering device, wherein the scattering device scatters the second light from the second supplemental laser source;

wherein the light guiding device receives, on a side facing away from the incident converted light, the second light which has been scattered by the scattering device and directs it to the second optical path to be output, wherein the scattering device and the wavelength conversion device are fixed relative to each other, wherein the light emitting device further includes a drive device, for driving the wavelength conversion device and the scattering device such that light spots respective formed by the first light and the second light on the wavelength conversion device and the scattering device move along predetermined paths; and wherein the light guiding device further includes a second reflective device, for directing at least a part of the second light that has been scattering reflected to a side of the light guiding device that faces away from the incident converted light.

10. The light emitting device of claim 9, wherein the second reflective device further directs the second light from the second supplemental laser source to the scattering device.

11. The light emitting device of claim 10, wherein the second light from the second supplemental laser source is incident along the first optical path on the light guiding device, and is directed by the light guiding device to the second reflective device.

* * * * *